United States Patent
Guo et al.

(10) Patent No.: US 11,018,688 B1
(45) Date of Patent: May 25, 2021

(54) DTC DEVICE AND METHOD BASED ON CAPACITIVE DAC CHARGING

(71) Applicant: Samsung Electronics Co., Ltd., Suwon-si (KR)

(72) Inventors: Chengkai Guo, Sunnyvale, CA (US); Wanghua Wu, Santa Clara, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/932,552

(22) Filed: Jul. 17, 2020

Related U.S. Application Data

(60) Provisional application No. 63/036,307, filed on Jun. 8, 2020.

(51) Int. Cl.
  *H03M 1/82* (2006.01)
  *H03M 1/80* (2006.01)
  *H03K 5/135* (2006.01)

(52) U.S. Cl.
  CPC ........... *H03M 1/825* (2013.01); *H03M 1/802* (2013.01); *H03K 5/135* (2013.01)

(58) Field of Classification Search
  CPC ....... H03M 1/825; H03M 1/802; H03K 5/135
  See application file for complete search history.

(56) References Cited

U.S. PATENT DOCUMENTS

| | | | |
|---|---|---|---|
| 8,004,441 B1 | 8/2011 | Beukema et al. | |
| 9,362,936 B1 | 6/2016 | Caffee et al. | |
| 9,584,177 B2 * | 2/2017 | Pavlovic | H03C 3/0991 |
| 10,075,178 B1 | 9/2018 | Yang | |
| 10,122,378 B2 | 11/2018 | Kim | |
| 10,218,364 B2 * | 2/2019 | Sai | H03L 7/0992 |
| 10,763,876 B2 * | 9/2020 | Lin | H03M 1/1009 |
| 10,797,714 B2 * | 10/2020 | Kinyua | H03M 1/0607 |
| 2020/0091608 A1 | 3/2020 | Alpman et al. | |

FOREIGN PATENT DOCUMENTS

CN   109863697 A   6/2019

OTHER PUBLICATIONS

US 9,369,138 B1, 06/2016, Caffee et al. (withdrawn)
Zhiyu, Jiayoon, et al., "A High-Linearity Digital-to-Time Converter Technique: Constant-Slope Charging," IEEE Journal of Solid-State Circuits, vol. 50, No. 6, Jun. 2015, 12 pages.

* cited by examiner

*Primary Examiner* — Brian K Young
(74) *Attorney, Agent, or Firm* — Lewis Roca Rothgerber Christie LLP

(57) ABSTRACT

A DTC circuit, includes: a DAC connected to a first node; a first switch connected between a first power source and a second node, and to provide a charge current to the second node according to a first switching signal; and a second switch connected between the first node and the second node, and to electrically connect the DAC to the second node according to a second switching signal. The DAC is to be charged to generate a voltage ramp corresponding to the charge current during a first DTC operational phase when the first and second switching signals have an active level to turn on the first and second switches, and to generate an input control word dependent voltage according to an input control word during a second DTC operational phase when the first and second switching signals have an inactive level to turn off the first and second switches.

20 Claims, 6 Drawing Sheets

DTC DEVICE AND METHOD BASED ON CAPACITIVE DAC CHARGING

CROSS-REFERENCE TO RELATED APPLICATION(S)

This application claims priority to and the benefit of U.S. Provisional Application No. 63/036,307, filed on Jun. 8, 2020, entitled "HIGH LINEARITY DTC BASED ON CAPACITIVE DAC CHARGING," the entire content of which is incorporated by reference herein.

FIELD

Aspects of one or more example embodiments of the present disclosure relate to a digital-to-time converter, and a method of driving the same.

BACKGROUND

Digital-to-time converters (DTC) convert digital signals to time interval signals by adjusting propagation delays of signal paths using digital control words. DTCs may be used in various applications, for example, such as fractional-N phase-locked-loop designs, time-interleaved analog-to-digital converter (ADC) time calibrations, and/or the like.

Generally, a DTC generates a voltage ramp by charging a charge capacitor according to a current source, or by resistor and capacitor charging, and outputs an output voltage having a delay corresponding to the digital control word. For example, DTCs may produce the delay by varying a slope of the voltage ramp, such as in the case of a variable slope DTC, or may produce the delay by varying starting voltages while the slope of the voltage ramp remains constant or substantially constant, such as in the case of a constant slope DTC. From among these, the constant slope DTC may have improved theoretical linearity than that of the variable slope DTC, as it may avoid different detector delays caused by different input slopes.

The above information disclosed in this Background section is for enhancement of understanding of the background of the present disclosure, and therefore, it may contain information that does not constitute prior art.

SUMMARY

One or more example embodiments of the present disclosure are directed to a digital-to-time converter (DTC), and more particularly, to a DTC having a digital-to-analog converter (DAC) configured to operate as a DAC and as a charging capacitor of the DTC.

One or more example embodiments of the present disclosure are directed to a method for driving the DTC.

According to one or more example embodiments of the present disclosure, a digital-to-time converter (DTC) circuit includes: a digital-to-analog converter (DAC) circuit connected to a first node; a first switch connected between a first power source and a second node, and configured to provide a charge current to the second node according to a first switching signal; and a second switch connected between the first node and the second node, and configured to electrically connect the DAC circuit to the second node according to a second switching signal. The DAC circuit is configured to be charged to generate a voltage ramp corresponding to the charge current during a first DTC operational phase when the first switching signal and the second switching signal has an active level to turn on the first and second switches, and to generate an input control word dependent voltage according to an input control word during a second DTC operational phase when the first switching signal and the second switching signal has an inactive level to turn off the first and second switches.

In an example embodiment, the DTC circuit may further include: a third switch connected between the second node and a second power source having a level different from that of the first power source, the third switch configured to discharge the second node according to a third switching signal; and a delay element connected between the second node and an output node of the DTC circuit. The third switch may be configured to be turned on according to an active level of the third switching signal during the second DTC operational phase, and turned off according to an inactive level of the third switching signal during the first DTC operational phase.

In an example embodiment, the delay element may include: a plurality of serially connected inverters connected between the second node and the output node; and a capacitor connected between the output node and the second power source.

In an example embodiment, the DAC may be configured to provide the input control word dependent voltage to the second node during a third DTC operational phase when the first switch may be turned off according to an inactive level of the first switching signal, the second switch may be turned on according to an active level of the second switching signal, and the third switch may be turned off according to an inactive level of the third switching signal to propagate the input control word dependent voltage to the second node through charge sharing as a final starting voltage.

In an example embodiment, the delay element may be configured to output a delayed output signal at the output node according to the final starting voltage at the second node.

In an example embodiment, the delay element may be configured to output the delayed output signal at the output node during a next DTC operation cycle.

In an example embodiment, the DAC circuit may include: a fourth switch connected between the first node and a reference voltage source, and configured to connect the first node to the reference voltage source according to a fourth switching signal; and a capacitor array including a plurality of parallel connected capacitors connected between the first node and a reset signal line. The capacitor array may be configured to generate the input control word dependent voltage during a first DAC operational phase of the second DTC operational phase when the fourth switching signal has an active level to turn on the fourth switch.

In an example embodiment, the DAC circuit may further include a plurality of AND logic gates connected in series with the plurality of parallel connected capacitors, respectively, between the plurality of parallel connected capacitors and the reset signal line, a first input of each of the plurality of AND logic gates being configured to receive a correspond bit of the input control word, and a second input of each of the plurality of AND logic gates being connected to the reset signal line.

In an example embodiment, each of the plurality of AND logic gates may be configured to provide the corresponding bit of the input control word to a corresponding one of the plurality of parallel connected capacitors according to a reset signal provided by the reset signal line.

In an example embodiment, the DTC circuit may further include: a third switch connected between the second node and a second power source having a level different from that of the first power source, the third switch configured to discharge the second node according to a third switching signal; and a timing circuit configured to generate the fourth switching signal, and the reset signal according to the third switching signal.

According to one or more example embodiments of the present disclosure, a method of operating a digital-to-time converter (DTC) circuit including a digital-to-analog converter (DAC) circuit connected to a first node, a first switch connected between a first power source and a second node, and a second switch connected between the first node and the second node, includes: providing a charge current to flow through the first switch and the second switch to charge the DAC circuit during a first DTC operational phase in which the first and second switches are turned on; and generating an input control word dependent voltage in the DAC circuit according to an input control word during a second DTC operational phase in which the first and second switches are turned off.

In an example embodiment, the DTC circuit may further include a third switch connected between the second node and a second power source having a level different from that of the first power source, and the method may further include: discharging a voltage at the second node during the second DTC operational phase in which the third switch is turned on.

In an example embodiment, the method may further include: providing the input control word dependent voltage to the second node through charge sharing as a final starting voltage during a third DTC operational phase when the first switch is turned off, the second switch is turned on, and the third switch is turned off.

In an example embodiment, the DTC circuit may further include a delay element connected between the second node and an output node of the DTC circuit, and the method may further include: outputting, by the delay element, a delayed output signal at the output node according to the final starting voltage at the second node.

In an example embodiment, the delayed output signal may be output by the delay element at the output node during a next DTC operation cycle.

In an example embodiment, the DAC circuit may include a fourth switch connected between the first node and a reference voltage source, and a capacitor array including a plurality of parallel connected capacitors connected between the first node and a reset signal line, and the providing of the charge current to the DAC circuit may include: turning off the fourth switch to electrically disconnect a top plate of each of the parallel connected capacitors from the reference voltage source; connecting a bottom plate of each of the parallel connected capacitors to Ground according to an inactive level of a reset signal; and charging a voltage corresponding to the charge current in the parallel connected capacitors.

In an example embodiment, the generating of the input control word dependent voltage may include: turning on the fourth switch to electrically connect the top plate of each of the parallel connected capacitors to the reference voltage source; providing corresponding bits of the input control word to the bottom plates of the parallel connected capacitors according to an active level of the reset signal; turning off the fourth switch; resetting the bottom plates of the parallel connected capacitors; and generating the input control word dependent voltage at the top plates of the parallel connected capacitors.

According to one or more example embodiments of the present disclosure, a digital-to-time converter (DTC) circuit includes: a timing circuit configured to generate a first switching signal, a second switching signal, and a third switching signal; a digital-to-analog converter (DAC) circuit connected to a first node; and a mirroring and switching circuit including: a first switch connected between a first power source and a second node, and configured to be controlled according to the first switching signal to generate a charge current; a second switch connected between the first node and the second node, and configured to be controlled according to the second switching signal to electrically connect the DAC circuit to the second node; a third switch connected between the second node and a second power source having a level that is different from that of the first power source, and configured to be controlled according to the third switching signal to discharge a voltage at the second node; and a delay element connected between the second node and an output node of the DTC circuit, and configured to generate a delayed output signal according to a start voltage at the second node. The DAC circuit is configured to be charged to generate a voltage ramp corresponding to the charge current during a first DTC operational phase when the first and second switching signals have an active level to turn on the first and second switches, and to generate an input control word dependent voltage according to an input control word during a second DTC operational phase when the first and second switching signals have an inactive level to turn off the first and second switches.

In an example embodiment, the DAC circuit may include: a fourth switch connected between the first node and a reference voltage source, and configured to connect the first node to the reference voltage source according to a fourth switching signal generated by the timing circuit; a capacitor array including a plurality of parallel connected capacitors connected between the first node and a reset signal line; and a plurality of AND logic gates connected in series with the plurality of parallel connected capacitors, respectively, between the plurality of connected capacitors and the reset signal line, a first input of each of the plurality of AND logic gates being configured to receive a correspond bit of the input control word, and a second input of each of the plurality of AND logic gates being connected to the reset signal line to receive a reset signal. Each of the AND logic gates may be configured to selectively provide the corresponding bit of the input control word to a corresponding one of the connected capacitors according to a level of the reset signal line.

In an example embodiment, the timing circuit may be configured to generate each of the first switching signal, the second switching signal, and the third switching signal according to a single input clock, and to generate each of the fourth switching signal and the reset signal according to the third switching signal.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
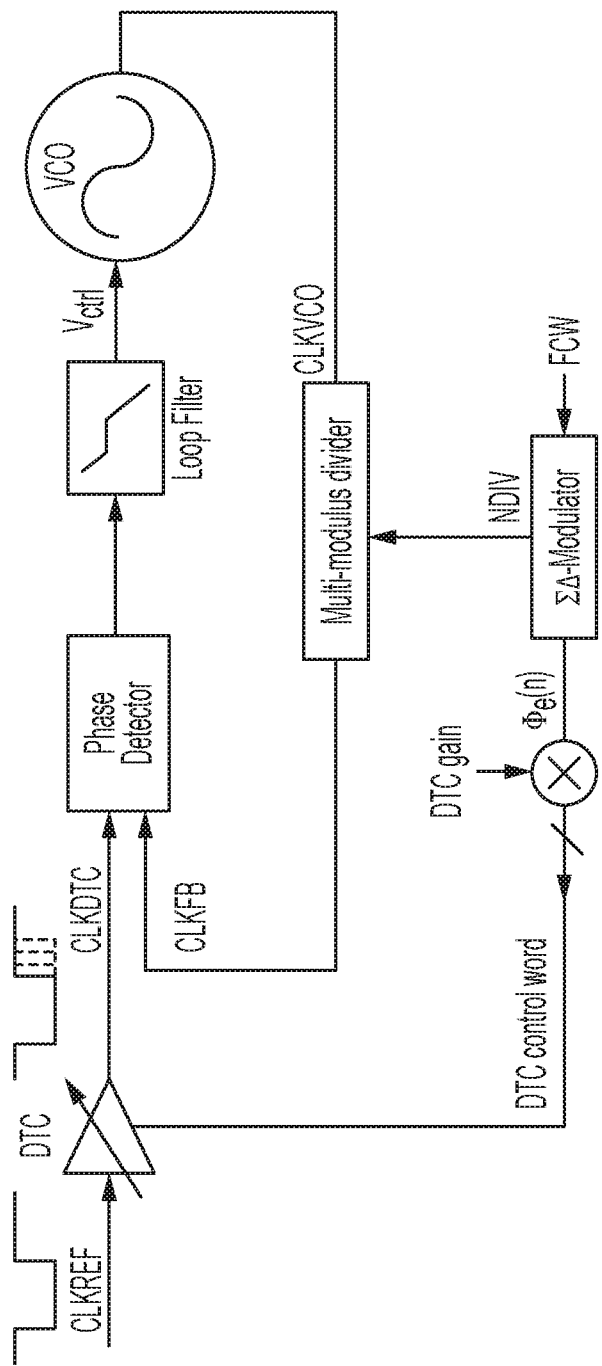
FIG. 1 is a block diagram of a fractional-N phase-locked loop circuit including a digital-to-time converter according to one or more example embodiments of the present disclosure.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

Constant slope DTCs may have improved linearity when compared to that of variable slope DTCs. For example, when a delay is produced by varying the slope of a voltage ramp, the slope of a delay element (e.g., a comparator, an inverter, and/or the like) that generates the delay may also be variable due to finite gain limitations of the delay element. Thus, the delay generated by the delay element may be different from an intended delay (e.g., a delay corresponding to the digital control word). On the other hand, when a delay is produced by varying the starting voltages, such that ramp voltages having constant or substantially constant rates as each other are applied to the delay element, the slope of the delay element may also be constant or substantially constant even when the ramp voltages have different starting voltages from each other. Accordingly, constant slope DTCs may have improved linearity when compared to that of variable slope DTCs.

Generally a constant slope DTC may include a digital-to-analog converter (DAC) to generate different starting voltages according to an input digital control word, and a separate charging capacitor connected to an output of the DAC to be charged by a current source (e.g., a constant current source or a reference current source). The charging capacitor may be further charged or discharged according to the starting voltage, which is generated by the DAC (based on the input digital control word), to generate a ramp voltage having a constant or substantially constant slope, such that the output of the delay element switches at different time instances according to different digital codes. When the DTC includes a separate charging capacitor, however, a profile (e.g., a form factor) of the DTC may be increased, especially in extra low noise applications requiring a large charging capacitor to suppress the noise, for example, such as in 5G communication systems supporting QAM64 or higher communication standards.

According to one or more example embodiments of the present disclosure, a digital-to-time converter (DTC) may include a capacitive digital-to-analog converter (CDAC). The CDAC may generate input control word dependent voltages such that a suitable starting voltage may be generated to provide delay programmability, and may further function as a charging capacitor of the DTC to be charged according to (e.g., charged by) a current source (e.g., a constant current source or a reference current source) such that a suitable ramp voltage having a constant or substantially constant slope may be generated. Accordingly, a profile of the DTC may be reduced, as a space for a separate charging capacitor may be omitted.

In some embodiments, because the CDAC may function as both a DAC and a charging capacitor, complexity of the DTC circuit may be reduced, and linearity may be improved. For example, because DTCs that include a separate charging capacitor may require complicated switching methods and topologies to control both the DAC operation and charging of the separate charging capacitor, where extra switches thereof may also become a source of non-linearity and phase noise through charge injection, clock feed through, and/or the like, by reducing the complexity of the DTC circuit and a driving method of the same, linearity of the overall DTC circuit may be improved (e.g., by reducing non-linear sources, such as complex switches, charge injection, clock feed through, and/or the like).

FIG. 1 is a block diagram of a fractional-N phase-locked loop design including a digital-to-analog converter according to one or more example embodiments of the present disclosure. The fractional-N phase-locked loop (PLL) design shown in FIG. 1 may be an example of an application where a high-linearity DTC may be desired.

According to one or more example embodiments of the present disclosure, in a DTC based fractional-N PLL design, the DTC may function to cancel quantization noise originated from dithering of a divider ratio. For example, the DTC may generate a delay from an input CLKREF to an output CLKDTC, which may be controlled by the same sigma delta modulator (SDM) code as the divider. Generally, in the DTC based fractional-N PLL design, DTC linearity may dominate the fractional_N spur level, which may fall in band depending on the frequency control word (FCW). Thus, if the DTC linearity is not high enough (e.g., is non-linear), the DTC may degrade the total integrated phase noise number when the fractional-N spur falls in band, which may not be tolerated in 5G communication systems (e.g., especially those that support QAM64 or even higher communication standards).

According to one or more example embodiments of the present disclosure, a constant slope DTC having improved linearity and phase noise may be provided, such that the DTC may improve the performance of a fractional-N PLL system, but the present disclosure is not limited thereto. In other words, while in FIG. 1, the DTC is shown as being a part of the fractional-N PLL design, the present disclosure is not limited thereto, and the DTC according to one or more example embodiments of the present disclosure may be used in any suitable applications that require or desire programmable time delays according to an input control word.

Figure 2:
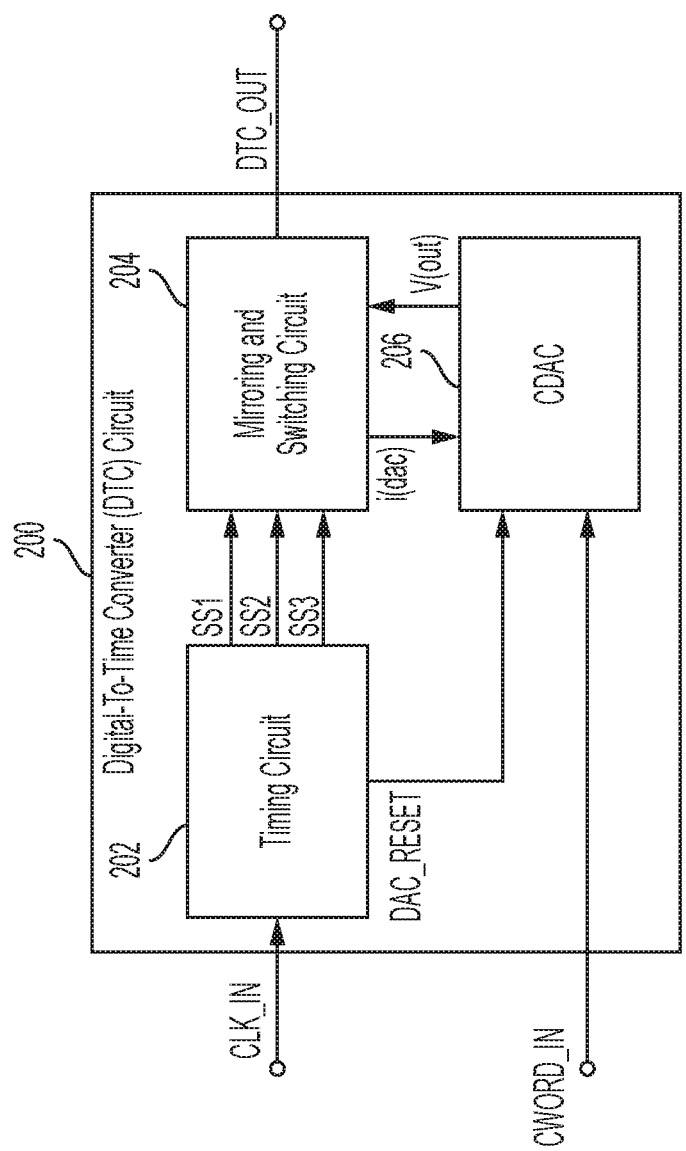
FIG. 2 is a block diagram of a digital-to-time converter according to one or more example embodiments of the present disclosure.

FIG. 2 is a block diagram of a digital-to-time converter according to one or more example embodiments of the present disclosure.

Referring to FIG. 2, a DTC circuit 200 according to one or more example embodiments of the present disclosure may include a timing circuit 202, a mirroring and switching circuit 204, and a capacitive digital-to-analog converter (CDAC) circuit 206. The timing circuit 202 may receive an input clock CLK_IN, and may generate various control signals (e.g., switching signals, DAC operational control signals, and/or the like), which may be used as clocking signals for different switches of the DTC circuit 200, according to the single input clock CLK_IN. For example, in some embodiments, the timing circuit 202 may generate a first switching signal SS1 for controlling a first switch SW1, a second switching signal SS2 for controlling a second switch SW2, and a third switching signal SS3 for controlling a third switch SW3. The first, second, and third switches SW1, SW2, and SW3 may control various operations of the DTC circuit 200. Accordingly, a simple timing control method using a single input clock CLK_IN to generate the switching signals SS1, SS2, and SS3 for controlling the DTC circuit 200 may be provided. However, the present disclosure is not limited thereto, and any one or more of the various signals generated by the timing control circuit 202 may be based on a separate signal (e.g., a separate clock signal).

The mirroring and switching circuit 204 may include the first switch SW1, the second switch SW2, and the third switch SW3, and may generate a delayed output voltage or signal DTC_OUT according to a starting voltage generated based on an input control word dependent voltage. The mirroring and switching circuit 204 may provide a charging current to charge the CDAC 206, and the CDAC 206 may generate and provide the input control word dependent voltage according to an input control word CWORD_IN. In some embodiments, the input control word dependent voltage may be provided to (e.g., charge shared with) the mirroring and switching circuit 204, such that a suitable starting voltage may be generated at an input of a delay element of the mirroring and switching circuit 204. The delay element may generate the delayed output voltage or signal DTC_OUT, which may be delayed according to the starting voltage, such that the actual generated delay is based on the starting voltage. Accordingly, a suitable output voltage or signal DTC_OUT having a delay with respect to the input clock CLK_IN according to the input control word CWORD_IN may be provided.

For example, in some embodiments, the operation of the DTC circuit 200 may include 3 DTC operational phases, a first DTC operational phase (e.g., a charging phase), a second DTC operational phase (e.g., a DAC operation phase), and a third DTC operational phase (e.g., a charge sharing phase). During the first DTC operational phase (e.g., the charging phase), the mirroring and switching circuit 204 may charge the CDAC 206 according to a current source (e.g., a constant current source or a reference current source). During the second DTC operational phase (e.g., the DAC operation phase), the CDAC 206 may be electrically isolated from the mirroring and switching circuit 204, and may operate in two DAC operational phases including a first DAC operational phase (e.g., a reset phase) and a second DAC operational phase (e.g., a conversion phase). During the first DAC operational phase, the CDAC 206 may generate and store an input control word dependent voltage according to the input control word CWORD_IN, and during the second DAC operational phase, the CDAC 206 may convert and output the input control word dependent voltage. During the third DTC operational phase (e.g., the charge sharing phase), the CDAC 206 may be electrically connected to the mirroring and switching circuit 204 to provide (e.g., to charge share) the input control word dependent voltage to the mirroring and switching circuit 204, such that a suitable starting voltage may be generated according to the input control word dependent voltage (e.g., after charge sharing). Accordingly, a separate charging capacitor may be omitted, and a profile of the DTC may be reduced.

In some embodiments, the timing circuit 202 may further generate a DAC operational signal DAC_RESET to control operations of the CDAC 206, and the DAC operational signal DAC_RESET may also be generated based on the single input clock CLK_IN. For example, in some embodiments, the DAC_RESET signal may be generated according to the third switching signal SS3, and may be used to generate a fourth switching signal SS4 and a reset signal SRESET to control various operations of the CDAC 206. Accordingly, separate controls for the CDAC 206 and a separate charging capacitor may be avoided, which may further reduce non-linearity sources (e.g., charge injection, clock feed through, and/or the like).

Figure 3:
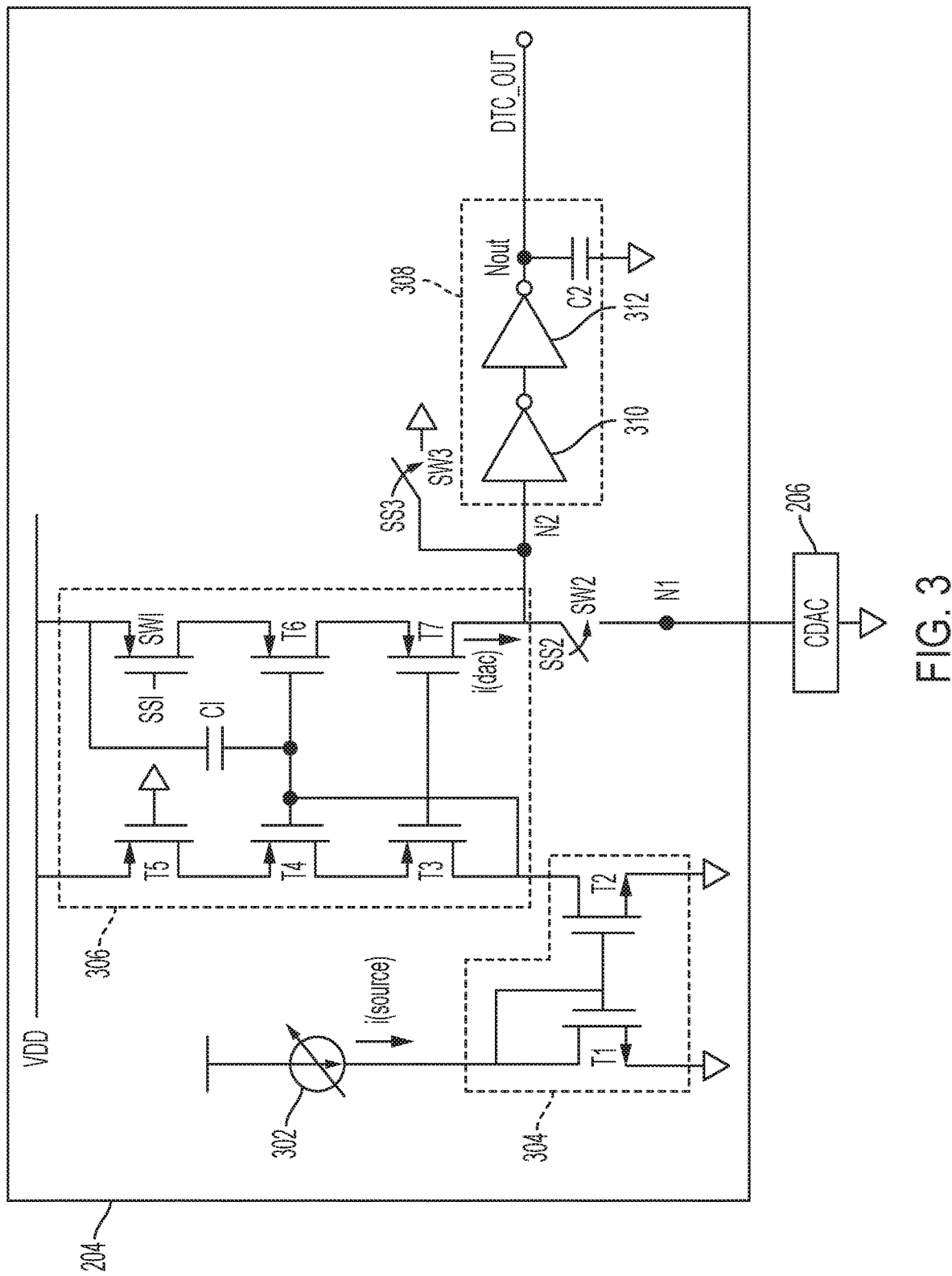
FIG. 3 is a schematic circuit diagram of a mirroring and switching circuit of the digital-to-time converter shown in FIG. 2.
Figure 4:
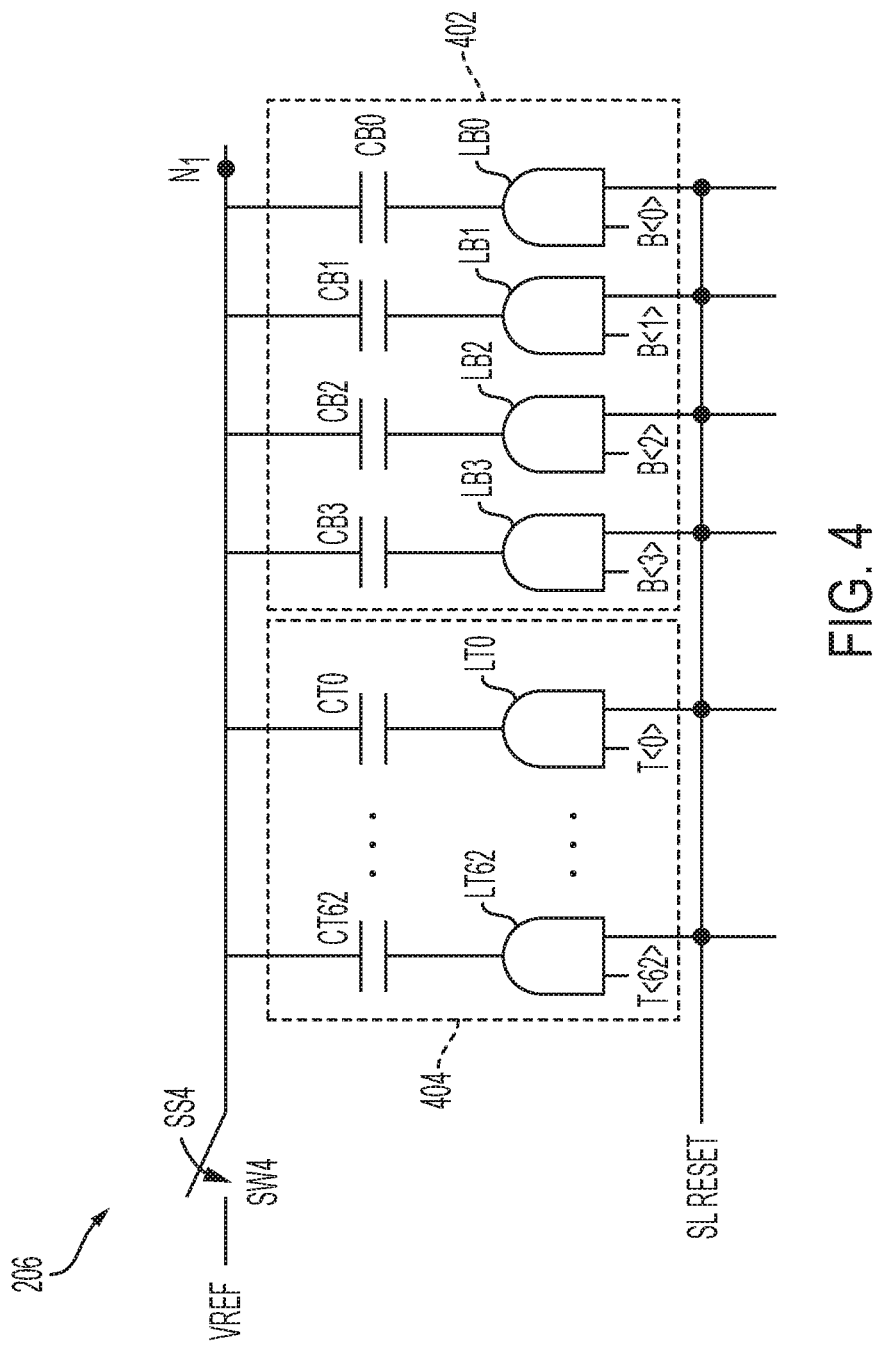
FIG. 4 is a schematic circuit diagram of a capacitive digital-to-analog converter of the digital-to-time converter shown in FIG. 2.
Figure 5:
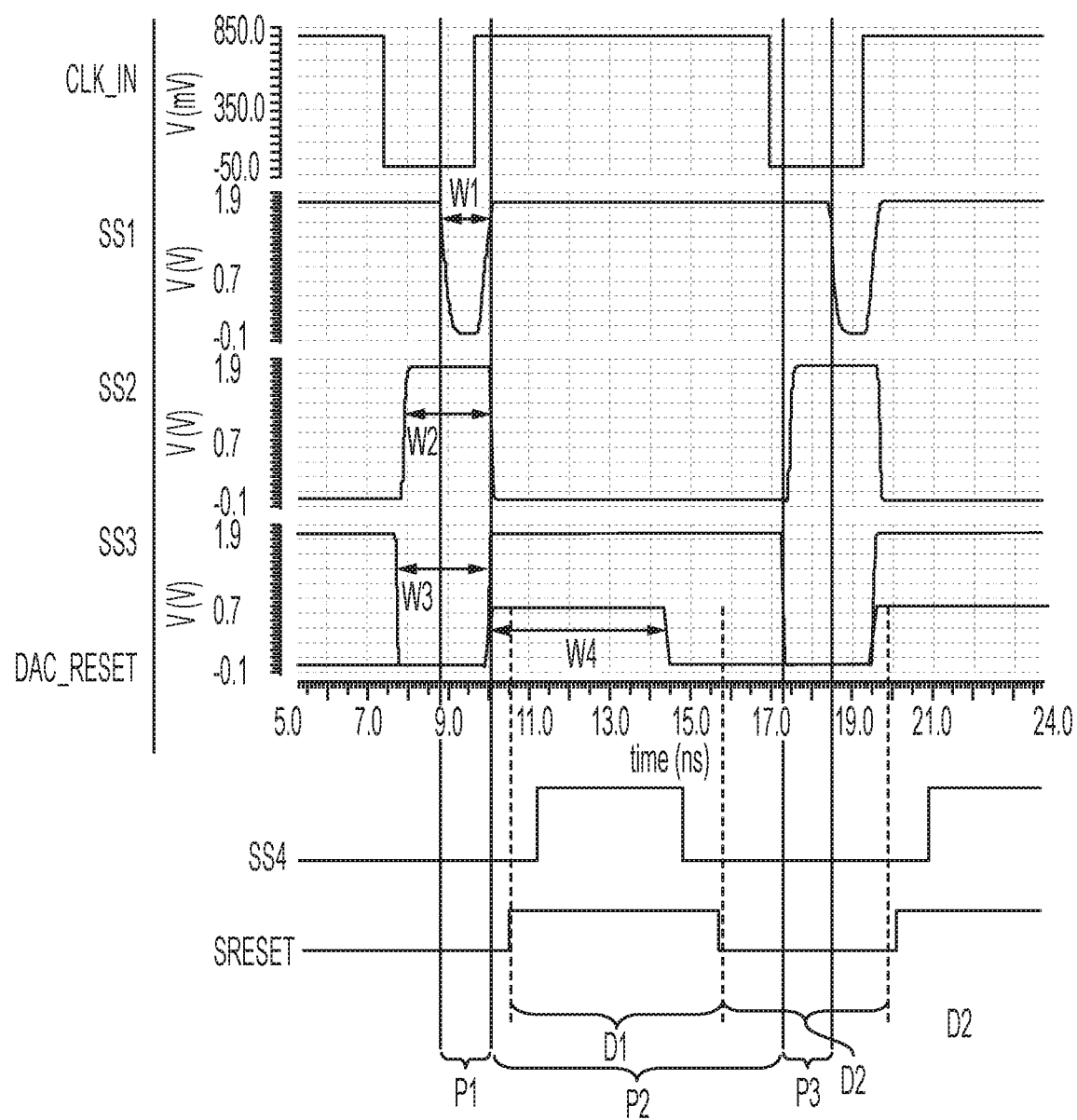
FIG. 5 is a signaling diagram illustrating various signals to drive the digital-to-time converter according to one or more example embodiments of the present disclosure.

FIG. 3 is a schematic circuit diagram of a mirroring and switching circuit of the digital-to-time converter shown in FIG. 2. For example, FIG. 3 shows the mirroring and switching circuit 204 of FIG. 2 in more detail, which may be connected to the CDAC circuit 206 shown in FIG. 2 and described in more detail below with reference to FIG. 4. FIG. 4 is a schematic circuit diagram of a capacitive digital-to-analog converter circuit of the DTC circuit shown in FIG. 2. FIG. 5 is a signaling diagram illustrating various signals to drive the DTC circuit according to one or more example embodiments of the present disclosure.

Referring to FIGS. 3-5, according to one or more example embodiments of the present disclosure, the mirroring and switching circuit 204 may be connected to the CDAC 206 at a first node N1, and may include a first switch SW1, a second switch SW2, and a third switch SW3 to control various operations of the DTC 200. For example, the first switch SW1 may be controlled (e.g., turned on and/or turned off) by the first switching signal SS1, the second switch SW2 may be controlled (e.g., turned on and/or turned off) by the second switching signal SS2, and the third switch SW3 may be controlled (e.g., turned on and/or turned off) by the third switching signal SS3, and the first, second, and third switches SW1, SW2, and SW3 may be turned on and/or turned off in various suitable combinations to control various operations of the DTC 200.

For example, according to one or more example embodiments of the present disclosure, an operation period of the DTC circuit 200 may be equal to or substantially equal to one period of the input clock CLK_IN, which may define (e.g., may be divided into) a first DTC operational phase (e.g., a charging phase) P1, a second DTC operational phase (e.g., a DAC operation phase) P2, and a third DTC operational phase (e.g., a charge sharing phase) P3. In the first DTC operational phase P1, the first switch SW1 may be turned on by the first switching signal SS1 having an active-level (e.g., a low level), the second switch SW2 may be turned on by the second switching signal SS2 having an active-level (e.g., a high level), and the third switch SW3 may be turned off by the third switching signal SS3 having an inactive level (e.g., a low level). Accordingly, during the first DTC operational phase P1, the CDAC 206 may be electrically connected to the mirroring and switching circuit 204 to be charged by a current source (e.g., a constant current source or a reference current source) 302.

In the second DTC operational phase P2, the first switch SW1 may be turned off by the first switching signal SS1 having an inactive level (e.g., a high level), the second switch may be turned off by the second switching signal SS2 having an inactive level (e.g., a low level), and the third switch SW3 may be turned on by the third switching signal SS3 having an active level (e.g., a high level). Accordingly, during the second DTC operational phase P2, the CDAC 206 may be electrically isolated from the mirroring and switching circuit 204 to generate a suitable input control word dependent voltage having a desired output range, and a second node N2 of the mirroring and switching circuit 306 may be connected to a second power source (e.g., VSS or Ground) having a level different (e.g., less) than that of a first power source VDD via the turned on third switch SW3 to discharge the second node N2.

In the third DTC operational phase P3, the first switch SW1 may maintain a turned off state by the first switching signal SS1 having the inactive level, the second switch SW2 may be turned on by the second switching signal SS2 having the active level, and the third switch SW3 may be turned off by the third switching signal SS3 having the inactive level. Accordingly, during the third DTC operational phase P3, the CDAC 206 may be electrically connected to the second node N2 to provide (e.g., to charge share) the input control word dependent voltage to the second node N2, such that a final starting voltage may be generated (e.g., through charge sharing) and provided to a delay element (e.g., a detector) 308 connected to the second node N2. The delay element 308 may produce a delay according to the final starting voltage, to output an output signal DTC_OUT that is delayed based on the input control word. For example, in some embodiments, the delay element 308 may output the output signal DTC_OUT during a first DTC operational phase (e.g., a charging phase) of a next DTC operation cycle (e.g., a next period of the input clock CLK_IN).

In more detail, in some embodiments, the mirroring and switching circuit 204 may be connected to the current source 302, and may further include a first current mirror circuit 304, a second current mirror circuit 306, and the delay element 308. The current source 302 may be connected to the first current mirror circuit 304, and may provide a source current (e.g., a constant current or a reference current) i(source) to the first current mirror circuit 304. During the first DTC operational phase P1 (e.g., when the first and second switches SW1 and SW2 are turned on and the third switch SW3 is turned off), the first current mirror circuit 304 may mirror the source current i(source) provided by the current source 302 to the second current mirror circuit 306, and the second current mirror circuit 306 may generate a charge current i(dac) corresponding to the mirrored source current i(source) to charge the CDAC 206. For example, in some embodiments, the first current mirror circuit 304 may include a first transistor T1 and a second transistor T2, and the second current mirror circuit 306 may include the first switch SW1, third through seventh transistors T3 through T7, and a first capacitor C1.

The first transistor T1 may include a first electrode (e.g., a source electrode) connected to the second power source (e.g., VSS or Ground), a second electrode (e.g., a drain electrode) connected to the current source 302, and a gate electrode connected to a gate electrode of the second transistor T2. The second electrode of the first transistor T1 may be further connected to the gate electrode of the first transistor T1, such that the first transistor is diode-connected. The second transistor T2 may include the gate electrode connected to the gate electrode of the first transistor T1, a first electrode (e.g., a source electrode) connected to the second power source, and a second electrode (e.g., a drain electrode) connected to the second current mirror 306. In some embodiments, as shown in FIG. 3, each of the first and second transistors T1 and T2 may be an NMOS (N-type Metal Oxide Semiconductor) transistor, but the present disclosure is not limited thereto.

The third transistor T3 may have a first electrode (e.g., a source electrode) connected to a second electrode (e.g., a drain electrode) of the fourth transistor T4, a second electrode (e.g., a drain electrode) connected to the second electrode of the second transistor T2, and a gate electrode connected to a gate electrode of the seventh transistor T7. The second electrode of the third transistor T3 may be further connected to a gate electrode of the fourth transistor T4. The fourth transistor T4 may have a first electrode (e.g., a source electrode) connected to a second electrode (e.g., a drain electrode) of the fifth transistor T5, the second electrode connected to the first electrode of the third transistor T3, and the gate electrode connected to a gate electrode of the sixth transistor T6 and the second electrode of the third transistor T3. The third transistor T3, the fourth transistor T4, the sixth transistor T6, and the seventh transistor T7 together may form a low voltage cascode current mirror.

The fifth transistor T5 may have a first electrode (e.g., a source electrode) connected to the first power source VDD having the voltage level that is different (e.g., that is greater) than that of the second power source (e.g., VSS or Ground), the second electrode connected to the first electrode of the fourth transistor T4, and a gate electrode connected to the second power source (e.g., VSS or Ground). The fifth transistor T5 may be biased to be in a turned-on state. The third, fourth, and fifth transistors may form one side of the second current mirror circuit 306.

The first switch SW1 may have a first electrode (e.g., a source electrode) connected to the first power source VDD, a second electrode (e.g., a drain electrode) connected to a first electrode (e.g., a source electrode) of the sixth transistor T6, and a gate electrode connected to the timing circuit 202 (e.g., one output of the timing circuit 202) to receive the first switching signal SS1. The first switch may be controlled according to a level of the first switching signal SS1. The sixth transistor T6 may have the first electrode connected to the second electrode of the first switch SW1, a second electrode (e.g., a drain electrode) connected to a first electrode (e.g., a source electrode) of the seventh transistor T7, and the gate electrode connected to the gate electrode of the fourth transistor T4.

The seventh transistor T7 may have the first electrode connected to the second electrode of the sixth transistor T6, a second electrode (e.g., a drain electrode) connected to the second node N2, and the gate electrode connected to the gate electrode of the third transistor T3. The first switch SW1, the sixth transistor T6, and the seventh transistor T7 may form the other side of the second current mirror circuit 306, such that when the first switch SW1 is turned on during the first DTC operational phase P1, the first switch SW1, the sixth transistor T6, and the seventh transistor T7 may form a current path to the second node N2, such that the charge current i(dac) may flow to the second node N2 through the current path.

The first capacitor C1 may be connected between the gate electrode of the sixth transistor T6 and the first power source VDD. The first capacitor C1 may maintain or substantially maintain the gate voltage of the sixth transistor T6 at a stable level, such that the charge current i(dac) flowing through the current path formed by the first switch SW1, the sixth transistor T6, and the seventh transistor T7 may be maintained or substantially maintained at a stable level. In some embodiments, as shown in FIG. 3, each of first switch SW1 and the third to seventh transistors T3 to T7 may be a PMOS (P-type Metal Oxide Semiconductor) transistor, but the present disclosure is not limited thereto.

The second switch SW2 may be connected between the first node N1 and the second node N2, and may be controlled by the second switching signal SS2 provided by the timing circuit 202. During the first DTC operational phase P1, the second switch SW2 may be turned on, such that at least a portion of the charge current i(dac) flows to the CDAC 206 to charge the CDAC 206. The third switch SW3 may be connected between the second node N2 and the second power source (e.g., VSS or Ground), and may be controlled by the third switching signal SS3 provided by the timing circuit 202. When the third switch SW3 is turned on during the second DTC operational phase P2, the third switch SW3 may discharge a voltage at the second node N2. In some embodiments, each of the second switch SW2 and the third switch SW3 may be implemented as any suitable kind of switch, for example, such as one or more transistors (e.g., an NMOS transistor, a PMOS transistor, a CMOS (a complementary metal-oxide semiconductor) transistor, and/or the like), a relay, and/or the like.

The delay element 308 may be connected between the second node N2 and an output node (or an output terminal) Nout to provide the delayed output signal DTC_OUT. For example, in some embodiments, when the voltage (e.g., ramp voltage) of the second node N2 increases according to (e.g., from) the starting voltage to be greater than a threshold voltage, the delay element 308 may delay the voltage according to the starting voltage (e.g., may generate a clock edge that is delayed form the input clock CLK_IN). For example, in some embodiments, the delay element 308 may include a plurality of inverters 310 and 312, and a second capacitor C2. The inverters 310 and 312 may be connected in series between the second node N2 and the output node Nout, and the second capacitor C2 may be connected between the output node Nout and the second power source (e.g., VSS or Ground) to mimic a loading circuit. However, the present disclosure is not limited thereto, and the delay element 308 may be implemented as any suitable kind of delay element, for example, such as a comparator, one or more inverters, and/or the like.

In some embodiments, the CDAC 206 may be connected to the second switch SW2 at the first node N1, and may include a fourth switch SW4, a first capacitor array and logic control circuit 402, and a second capacitor array and logic control circuit 404. The fourth switch SW4 may be connected between the first node N1 and a reference voltage source VREF (e.g., a DC voltage source), and may selectively connect the first node N1 to the reference voltage source VREF according to a fourth switching signal SS4. For example, when the fourth switching signal SS4 has an active level (e.g., a high level), the fourth switch may electrically connect the first node N1 to the reference voltage source VREF. In some embodiments, the fourth switch SW4 may be implemented as any suitable kind of switch, for example, such as one or more transistors (e.g., an NMOS transistor, a PMOS transistor, a CMOS transistor, and/or the like), a relay, and/or the like.

Each of the first capacitor array and logic control circuit 402 and the second capacitor array and logic control circuit 404 may be connected between the first node N1 and a reset signal line SLRESET. For example, the first and second capacitor array and logic control circuits 402 and 404 may be connected in parallel to each other between the first node N1 and the reset signal line SLRESET. The reset signal line SLRESET may provide a reset signal SRESET to a first input of each of the first and second capacitor array and logic control circuits 402 and 404, and respective bits B0 to T62 of the input control word may be provided to a second input of each of the first and second capacitor array and logic control circuits 402 and 404. An operation of the first and second capacitor array and logic control circuits 402 and 404 may be controlled according to the fourth switching signal SS4 and the reset signal SRESET.

For example, in some embodiments, the CDAC 206 may operate in 2 DAC operational phases, a first DAC operational phase (e.g., a DAC reset phase) D1, in which the reset signal SRESET has an active level (e.g., a high level) and the fourth switch SW4 is turned on according to the active level of the fourth switching signal SS4, and a second DAC operational phase (e.g., a DAC conversion phase) D2, in which the reset signal SRESET has an inactive level (e.g., a low level or a reset level) and the fourth switch SW4 is turned off according to an inactive level (e.g., a low level) of the fourth switching signal SS4. In some embodiments, an entirely of the first DAC operational phase D1 may overlap with the second DTC operational phase P2, and the second DAC operational phase D2 may at least partially overlap with the first, second, and third DTC operational phases P1, P2, and P3.

For example, during the first DAC operational phase D1, each of the first and second capacitor array and logic control circuits 402 and 404 may be connected to the reference voltage source VREF via the turned on fourth switch SW4, and may receive corresponding bits B0 to T62 of the input control word according to the active level of the reset signal SRESET, such that the first and second capacitor array and logic control circuits 402 and 404 may store respective input control word dependent voltages therein. During the second DAC operational phase D2, each of the first and second capacitor array and logic control circuits 402 and 404 may be connected between the first node N1, which may be floating during at least a portion (e.g., a part) of the second DAC operational phase D2 (e.g., during the second DTC operational phase P2), for example, when the second switch SW2 and the fourth switch SW4 are turned off, and may be prevented from receiving the corresponding bit of the input control word by the reset signal RESET having the inactive level. For example, during the second DAC operational phase D2, each of the second inputs of the first and second capacitor array and logic control circuits 402 and 404 may be connected to Ground (e.g., may be provided with a voltage (e.g., 0 V) corresponding to Ground), such that the first and second capacitor array and logic control circuits 402 and 404 ignore the respective bits B0 to T62 of the input control word.

In more detail, in some embodiments, the first and second capacitor array and logic control circuits 402 and 404 may include a plurality of parallel connected capacitors CB0 through CT62, and a plurality of parallel connected logic gates (e.g., AND gates) LB0 through LT62. The parallel connected logic gates CB0 through CT62 may be respectively connected to the parallel connected capacitors CB0 through CT62 in series between the first node N1 and the reset signal line SLRESET. In this case, during the first DAC operational phase D1, a top plate of each of the parallel connected capacitors CB0 through CT62 may be connected to the reference voltage source VREF through the turned on fourth switch SW4, and a bottom plate thereof may receive an output of the corresponding logic gates LB0 through LT62 according to the respective bits of the input control word input thereto. For example, because the active level (e.g., the high-level) of the reset signal SLREST may be applied to the first input of each of the logic gates LB0 through LT62 during the first DAC operational phase D1, the output of each of the logic gates LB0 through LT62 may correspond to a value of the respective bits B0 to T62 of the input control word input to the second input of the logic gates LB0 through LT62.

During the second DAC operational phase D2, the top plates of each of the parallel connected capacitors CB0 through CT62 may be electrically disconnected from the reference voltage source VREF according to the turned off fourth switch SW4, and the bottom plate of each of the parallel connected capacitors CB0 through CT62 may receive the voltage corresponding to Ground (e.g., 0 V), as the output of each of the logic gates LB0 through LT62 may be equal to or substantially equal to 0 V according to the reset signal SRESET having the inactive level (e.g., the low level). Thus, during the second DAC operational phase D2, the first node N1 may be in a floating state depending on whether the second switch SW2 is turned on (e.g., during the second DTC operational phase P2) or turned off (e.g., during the first and third DTC operational phases P1 and P3).

The plurality of parallel connected capacitors CB0 through CT62 may be connected in series to the plurality of parallel connected logic gates LB0 to LT62, respectively, between the first node N1 and the reset signal line SLRESET. For a non-limiting example, in some embodiments, the first capacitor array and logic control circuit 402 may include a plurality of parallel connected binary capacitors CB0 to CB3, and the second capacitor array and logic control circuit 404 may include a plurality of parallel connected monitoring capacitors CT0 to CT62. A number and/or capacitance of the binary capacitors CB0 to CB3 and a number and/or capacitance of the monitoring capacitors CT0 to CT62 may be variously modified according to a number of bits of the input control word. For example, in some embodiments, the segmentation between the binary capacitors CB0 to CB3 and the monitoring capacitors CT0 to CT62 may be based on a balance between capacitor mismatch, decoding logic complexity, available space of a layout area, and/or the like.

For a non-limiting example, when the input control word is a 10-bit input control word, the first four bits of the 10-bit input control word may correspond to 4 binary capacitors CB0 to CB3, and the last six bits of the 10-bit input control word may correspond to 63 monitoring capacitors CT0 to CT62. In this case, a capacitance of each of the four binary capacitors CB0 to CB3 may increase according to a bit position of the capacitors CB0 to CB3 (corresponding to the bit position of the corresponding bit of the input control word), and the capacitance of each of the 63 monitoring capacitors CT0 to CT62 may have the same or substantially the same capacitance as each other according to a subsequent bit position from the four binary capacitors CB0 to CB3. For example, if a capacitance of a first binary capacitor (e.g., corresponding to the first bit B0 of the input control word) CB0 is equal to Cmin, a next adjacent binary capacitor (e.g., the second binary capacitor corresponding to the second bit B1) CB1 may have a capacitance equal to or substantially equal to 2×Cmin, the third binary capacitor (e.g., corresponding to the third bit B2) CB2 may have a capacitance equal to or substantially equal to 4×Cmin, and the fourth binary capacitor (e.g., corresponding to the fourth bit B3) CB3 may have a capacitance equal to or substantially equal to 8×Cmin. In this example, each of the monitoring capacitors CT0 to CT62 may have a capacitance equal to or substantially equal to 16×Cmin.

However, the present disclosure is not limited to the example shown in FIG. 4, and the CDAC 206 may include one or more kinds of capacitor array and logic control circuits having any suitable number of parallel connected capacitors with any suitable segmentations according to the input control word (e.g., according to a kind or a number of bits of the input control word) as would be understood by those having ordinary skill in the art. For example, depending on the number of bits of the input control word, the CDAC 206 may have more or less capacitor array and logic control circuits, and each of the capacitor array and logic control circuits may have more or less capacitors with the same or varying capacitances as each other.

Accordingly, as shown in FIG. 5, in some embodiments, during the first DTC operational phase (e.g., the charging phase) P1, the first switch SW1 may be turned on according to the active level of the first switching signal SS1, the second switch SW2 may be turned on according to the active level of the second switching signal SS2, the third switch SW3 may be turned off according to the inactive level of the third switching signal SS3, the fourth switch SW4 may be turned off according to the inactive level of the fourth switching signal SS4, and the reset signal SRESET may have the inactive level. In this case, during the first DTC operational phase P1, the top plates of each of the first and second capacitor array and logic control circuits 402 and 404 may be connected to the mirroring and switching circuit 204 via the turned on second switch SW2, and the bottom plates of each of the first and second capacitor array and logic control circuits 402 and 404 may be connected to Ground (e.g., may receive 0 V) according to the level of the reset signal SRESET having the inactive level being output via the logic gates LB0 through LT62. Thus, the first and second capacitor array and logic control circuits 402 and 404 may be electrically connected to the mirroring and switching circuit 204 to generate a voltage ramp having a slope based on the current source 302 and a mirroring ratio of the mirroring circuits 304 and 306.

During the second DTC operational phase (e.g., the DAC operation period) P2, the first switch SW1 may be turned off according to the inactive level of the first switching signal SS1 to stop a flow of the charge current i(dac), the second switch SW2 may be turned off according to the inactive level of the second switching signal SS2 to electrically isolate the CDAC 206 from the second node N2, the third switch SW3 may be turned on according to the active level of the third switching signal SS3 to discharge the second node N2, and the CDAC 206 may operate in the first DAC operational phase D1 and at least a portion of the second DAC operational phase D2. For example, during the second DTC operational phase P2, the reset signal SRESET may transition from the inactive level to the active level in the first DAC operational phase D1, such that the bottom plates of each of the first and second capacitor array and logic control circuits 402 and 404 may receive their respective bits of the input control word, and the fourth switching signal SS4 may transition from the inactive level to the active level, such that the fourth switch SW4 is turned on. In this case the first and second capacitor array and logic control circuits 402 and 404 may generate the input control word dependent voltage.

Subsequently, still during the second DTC operational phase P2, the reset signal SRESET may transition to the inactive level, and the fourth switching signal may transition to the inactive level. Accordingly, the bottom plates of each of the first and second capacitor array and logic control circuits 402 and 404 may be connected to Ground (e.g., may receive 0 V), and the first node N1 connected to the top plates thereof may be floating according to the turned off fourth switch SW4 and the turned off second switch SW2. In this case, the first DAC operational phase D1 of the second DTC operational phase P2 may be longer than the second DAC operational phase D2 of the second DTC operational phase P2, for example, to allow sufficient time for generating the input control word dependent voltage.

During the third DTC operational phase P3, the first switch may maintain or substantially maintain a turned off state according to the inactive level of the first switching signal SS1, the second switch may be turned on according to the active level of the second switching signal SS2 to electrically connect the first node N1 to the second node N2, the third switch SW3 may be turned off according to the inactive level of the third switching signal SS3, and the CDAC 206 may maintain or substantially maintain the second DAC operational phase D2. In this case, the CDAC 206 may provide (e.g., may charge share) the generated input control word dependent voltage to the second node N2, and the voltage of the second node N2 may be increased according to the input control word dependent voltage to generate the final starting voltage according to the input control word.

Subsequently (e.g., during the first DTC operational phase P1 of a next DTC operation cycle), the first switch SW1 may be turned on according to the active level of the first switching signal SS1, the second switch SW2 may be turned on according to the active level of the second switching signal SS2, and the third switch SW3 may be turned off according to the inactive level of the third switching signal SS3. In this case, a portion of the charge voltage i(dac) may be provided to the second node N2, and the second node N2 may increase from the final starting voltage, such that a ramp voltage having a constant slope may be generated. As the ramp voltage is increased to be greater than or equal to a threshold voltage, the delay element 308 may generate and output the delayed output signal DTC_OUT having the desired or suitable delay according to the final starting voltage.

Figure 6:
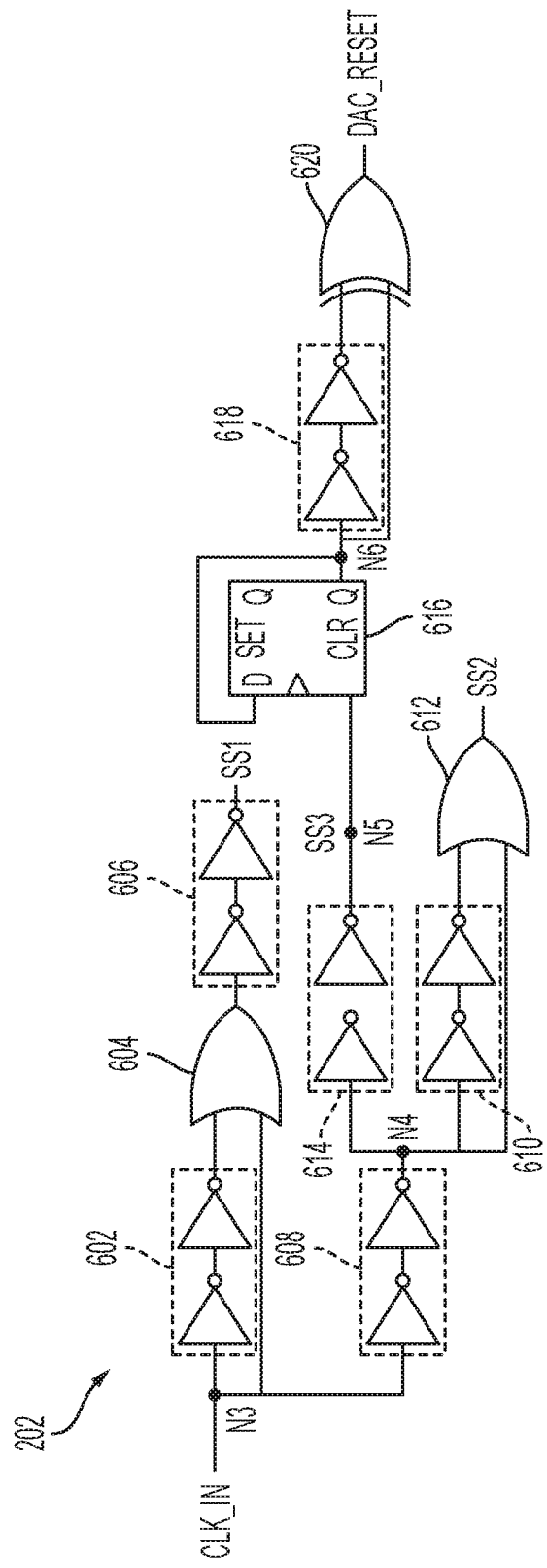
FIG. 6 is a schematic circuit diagram of a timing circuit to generate different clock signals for driving the digital-to-time converter shown in FIG. 2.

FIG. 6 is a schematic circuit diagram of a timing circuit of the DTC shown in FIG. 2.

Referring to FIGS. 5 and 6, according to one or more example embodiments of the present disclosure, the timing circuit 202 may generate each of the first switching signal SS1, the second switching signal SS2, the third switching signal SS3, and a DAC operational signal DAC_RESET (which may be used to generate the fourth switching signal SS4 and the reset signal SRESET) from a single input clock CLK_IN. For example, in some embodiments, the third switching signal SS3 may be generated by delaying the input clock CLK_IN, the first switching signal SS1 may be generated from an OR function between the input clock CLK_IN and a delayed version of the input clock CLK_IN, and the second switching signal SS2 may be generated from an OR function between a delayed version of the input clock CLK_IN and a further delayed version of the input clock CLK_IN.

The DAC operational signal DAC_RESET, which may be used to generate the fourth switching signal SS4 and the reset signal SRESET, may be generated from the third switching signal SS3. For example, the DAC operational signal DAC_RESET may be generated by dividing the frequency of the third switching signal SS3 by 2, and thus, extracting a rising edge of the third switching signal SS3, and then using an edge to pulse generation circuit to generate the DAC operational signal DAC_RESET. The fourth switching signal SS4 and the reset signal SRESET may be generated from the DAC operational signal DAC_RESET, for example, as delayed versions of the DAC operational signal DAC_RESET. For example, the reset signal SRESET and the fourth switching signal SS4 may be generated as a delayed version or as a level shifted version of the DAC operational signal DAC_RESET.

For example, in more detail, in some embodiments, the timing circuit 202 may include a first inverter delay chain 602, a first OR logic gate 604, a first delay element 606, a second delay element 608, a second inverter delay chain 610, a second OR logic gate 612, a third delay element 614, a flip-flop (e.g., a D-type flip-flop) 616, a third inverter delay chain 618, and an XOR logic gate 620. The first switching signal SS1 may be generated from the input clock CLK_IN via the first inverter delay chain 602, the first OR logic gate 604, and the first delay element 606. The second switching signal SS2 may be generated from the input clock CLK_IN via the second delay element 608, the second inverter delay chain 610, and the second OR logic gate 612. The third switching signal SS3 may be generated from the input clock CLK_IN via the second delay element 608, and the third delay element 614. The DAC operational signal DAC_RESET may be generated from the third switching signal SS3 via the flip-flop 616, the third inverter delay chain 618, and the XOR logic gate 620.

For example, in some embodiments, the input clock CLK_IN may be received at a third node (e.g., an input node) N3 of the timing circuit 202. The first inverter delay chain 602 may include a plurality of inverters that are serially connected between the third node N3 and a first input of the first OR logic gate 604. A second input of the first OR logic gate 604 may be connected to the third node N3 to receive the input clock CLK_IN. An output of the first OR logic gate 604 may be connected to an input of the first delay element 606, which includes a plurality of serially connected inverters connected between the input of the first delay element 606 and an output of the first delay element 606. The output of the first delay element 606 may provide the first switching signal SS1. In this case, a pulse width W1 of the first switching signal SS1 may correspond to a low period of the input clock CLK_IN minus the first inverter delay 602.

In some embodiments, the second delay element 608 may include a plurality of serially connected inverters connected between the third node N3 and a fourth node N4. The second inverter delay chain 610 may include a plurality of serially connected inverters connected between the fourth node N4 and a first input of the second OR logic gate 612. A second input of the second OR logic gate 612 may be connected to the fourth node N4. An output of the second OR logic gate 612 may provide the second switching signal SS2. In this case, a pulse width W2 of the second switching signal SS2 may correspond to a low period of the input clock CLK_IN minus the second inverter delay 610.

In some embodiments, the third delay element 614 may include a plurality of serially connected inverters connected between the fourth node N4 and a fifth node N5. An output of the third delay element 614 may be connected to the fifth node N5 to provide the third switching signal SS3. In this case, a pulse width W3 of the third switching signal SS3 may correspond to the low period of the input clock CLK_IN.

In some embodiments, the flip flop 616 may be connected between the fifth node N5 and a sixth node N6. For example, a first input (e.g., a clock input terminal) of the flip flop 616 may be connected to the fifth node N5 to receive the third switching signal SS3 (e.g., as a clock input signal), and a second input (e.g., a data input terminal) of the flip flop 616 may be connected to the sixth node N6. An output terminal (e.g., an inverted output terminal or Q bar output) of the flip flop 616 may be connected to the sixth node N6. The third inverter delay chain 618 may include a plurality of serially connected inverters connected between the sixth node N6 and a first input of the XOR logic gate 620. A second input of the XOR logic gate 620 may be connected to the sixth node N6. An output of the XOR logic gate 620 may provide the DAC operational signal DAC_RESET, which may be further delayed and/or level shifted to generate the reset signal SRESET and the fourth switching signal SS4 as discussed above. In this case, a pulse width W4 of the DAC operation signal DAC_RESET may correspond to the third inverter delay 618.

According to one or more example embodiments of the present disclosure, a DTC includes a CDAC that may selectively operate as a charging capacitor and to generate an input control word dependent voltage such that a suitable starting voltage may be generated. According to one or more example embodiments of the present disclosure, a simple control method of the DTC is provided in which the DTC is controlled according to a single input clock. Accordingly, a profile of the DTC may be reduced, and linearity of the DTC may be improved.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:
1. A digital-to-time converter (DTC) circuit, comprising:
a digital-to-analog converter (DAC) circuit connected to a first node;
a first switch connected between a first power source and a second node, and configured to provide a charge current to the second node according to a first switching signal; and a second switch connected between the first node and the second node, and configured to electrically connect the DAC circuit to the second node according to a second switching signal, wherein the DAC circuit is configured to be charged to generate a voltage ramp corresponding to the charge current during a first DTC operational phase when the first switching signal and the second switching signal has an active level to turn on the first and second switches, and to generate an input control word dependent voltage according to an input control word during a second DTC operational phase when the first switching signal and the second switching signal has an inactive level to turn off the first and second switches.

2. The circuit of claim 1, wherein the DTC circuit further comprises:
a third switch connected between the second node and a second power source having a level different from that of the first power source, the third switch configured to discharge the second node according to a third switching signal; and
a delay element connected between the second node and an output node of the DTC circuit,
wherein the third switch is configured to be turned on according to an active level of the third switching signal during the second DTC operational phase, and turned off according to an inactive level of the third switching signal during the first DTC operational phase.

3. The circuit of claim 2, wherein the delay element comprises:
a plurality of serially connected inverters connected between the second node and the output node; and
a capacitor connected between the output node and the second power source.

4. The circuit of claim 2, wherein the DAC is configured to provide the input control word dependent voltage to the second node during a third DTC operational phase when the first switch is turned off according to an inactive level of the first switching signal, the second switch is turned on according to an active level of the second switching signal, and the third switch is turned off according to an inactive level of the third switching signal to propagate the input control word dependent voltage to the second node through charge sharing as a final starting voltage.

5. The circuit of claim 4, wherein the delay element is configured to output a delayed output signal at the output node according to the final starting voltage at the second node.

6. The circuit of claim 5, wherein the delay element is configured to output the delayed output signal at the output node during a next DTC operation cycle.

7. The circuit of claim 1, wherein the DAC circuit comprises:
a fourth switch connected between the first node and a reference voltage source, and configured to connect the first node to the reference voltage source according to a fourth switching signal; and
a capacitor array comprising a plurality of parallel connected capacitors connected between the first node and a reset signal line,
wherein the capacitor array is configured to generate the input control word dependent voltage during a first DAC operational phase of the second DTC operational phase when the fourth switching signal has an active level to turn on the fourth switch.

8. The circuit of claim 7, wherein the DAC circuit further comprises a plurality of AND logic gates connected in series with the plurality of parallel connected capacitors, respectively, between the plurality of parallel connected capacitors and the reset signal line, a first input of each of the plurality of AND logic gates being configured to receive a correspond bit of the input control word, and a second input of each of the plurality of AND logic gates being connected to the reset signal line.

9. The circuit of claim 8, wherein each of the plurality of AND logic gates is configured to provide the corresponding bit of the input control word to a corresponding one of the plurality of parallel connected capacitors according to a reset signal provided by the reset signal line.

10. The circuit of claim 9, wherein the DTC circuit further comprises:
a third switch connected between the second node and a second power source having a level different from that of the first power source, the third switch configured to discharge the second node according to a third switching signal; and
a timing circuit configured to generate the fourth switching signal, and the reset signal according to the third switching signal.

11. A method of operating a digital-to-time converter (DTC) circuit comprising a digital-to-analog converter (DAC) circuit connected to a first node, a first switch connected between a first power source and a second node, and a second switch connected between the first node and the second node, the method comprising:
providing a charge current to flow through the first switch and the second switch to charge the DAC circuit during a first DTC operational phase in which the first and second switches are turned on; and
generating an input control word dependent voltage in the DAC circuit according to an input control word during a second DTC operational phase in which the first and second switches are turned off.

12. The method of claim 11, wherein the DTC circuit further comprises a third switch connected between the second node and a second power source having a level different from that of the first power source, and the method further comprises:
discharging a voltage at the second node during the second DTC operational phase in which the third switch is turned on.

13. The method of claim 12, further comprising:
providing the input control word dependent voltage to the second node through charge sharing as a final starting voltage during a third DTC operational phase when the first switch is turned off, the second switch is turned on, and the third switch is turned off.

14. The method of claim 13, wherein the DTC circuit further comprises a delay element connected between the second node and an output node of the DTC circuit, and the method further comprises:
outputting, by the delay element, a delayed output signal at the output node according to the final starting voltage at the second node.

15. The method of claim 14, wherein the delayed output signal is output by the delay element at the output node during a next DTC operation cycle.

16. The method of claim 11, wherein the DAC circuit comprises a fourth switch connected between the first node and a reference voltage source, and a capacitor array comprising a plurality of parallel connected capacitors connected between the first node and a reset signal line, and the providing of the charge current to the DAC circuit comprises:

turning off the fourth switch to electrically disconnect a top plate of each of the parallel connected capacitors from the reference voltage source;

connecting a bottom plate of each of the parallel connected capacitors to Ground according to an inactive level of a reset signal; and charging a voltage corresponding to the charge current in the parallel connected capacitors.

17. The method of claim 16, wherein the generating of the input control word dependent voltage comprises:

turning on the fourth switch to electrically connect the top plate of each of the parallel connected capacitors to the reference voltage source;

providing corresponding bits of the input control word to the bottom plates of the parallel connected capacitors according to an active level of the reset signal;

turning off the fourth switch;

resetting the bottom plates of the parallel connected capacitors; and generating the input control word dependent voltage at the top plates of the parallel connected capacitors.

18. A digital-to-time converter (DTC) circuit, comprising:

a timing circuit configured to generate a first switching signal, a second switching signal, and a third switching signal;

a digital-to-analog converter (DAC) circuit connected to a first node; and a mirroring and switching circuit comprising:

a first switch connected between a first power source and a second node, and configured to be controlled according to the first switching signal to generate a charge current;

a second switch connected between the first node and the second node, and configured to be controlled according to the second switching signal to electrically connect the DAC circuit to the second node;

a third switch connected between the second node and a second power source having a level that is different from that of the first power source, and configured to be controlled according to the third switching signal to discharge a voltage at the second node; and a delay element connected between the second node and an output node of the DTC circuit, and configured to generate a delayed output signal according to a start voltage at the second node, wherein the DAC circuit is configured to be charged to generate a voltage ramp corresponding to the charge current during a first DTC operational phase when the first and second switching signals have an active level to turn on the first and second switches, and to generate an input control word dependent voltage according to an input control word during a second DTC operational phase when the first and second switching signals have an inactive level to turn off the first and second switches.

19. The circuit of claim 18, wherein the DAC circuit comprises:

a fourth switch connected between the first node and a reference voltage source, and configured to connect the first node to the reference voltage source according to a fourth switching signal generated by the timing circuit;

a capacitor array comprising a plurality of parallel connected capacitors connected between the first node and a reset signal line; and a plurality of AND logic gates connected in series with the plurality of parallel connected capacitors, respectively, between the plurality of connected capacitors and the reset signal line, a first input of each of the plurality of AND logic gates being configured to receive a correspond bit of the input control word, and a second input of each of the plurality of AND logic gates being connected to the reset signal line to receive a reset signal, wherein each of the AND logic gates is configured to selectively provide the corresponding bit of the input control word to a corresponding one of the connected capacitors according to a level of the reset signal line.

20. The circuit of claim 19, wherein the timing circuit is configured to generate each of the first switching signal, the second switching signal, and the third switching signal according to a single input clock, and to generate each of the fourth switching signal and the reset signal according to the third switching signal.

* * * * *